(12) United States Patent
Seki

(10) Patent No.: US 8,190,387 B2
(45) Date of Patent: May 29, 2012

(54) FREQUENCY MEASUREMENT APPARATUS

(75) Inventor: Kempei Seki, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 331 days.

(21) Appl. No.: 12/305,287

(22) PCT Filed: Feb. 19, 2007

(86) PCT No.: PCT/JP2007/052967
§ 371 (c)(1),
(2), (4) Date: Dec. 17, 2008

(87) PCT Pub. No.: WO2008/114328
PCT Pub. Date: Sep. 25, 2008

(65) Prior Publication Data
US 2010/0010762 A1    Jan. 14, 2010

(51) Int. Cl.
*G01R 23/00* (2006.01)
(52) U.S. Cl. ............ 702/75; 702/64; 702/72; 324/76.39
(58) Field of Classification Search .................... 702/75
See application file for complete search history.

(56) References Cited

U.S. PATENT DOCUMENTS

| | | | | |
|---|---|---|---|---|
| 3,990,007 | A * | 11/1976 | Hohhof | 324/76.72 |
| 4,547,726 | A | 10/1985 | Premerlani | |
| 5,832,414 | A * | 11/1998 | Hart et al. | 702/77 |
| 6,219,623 | B1 | 4/2001 | Wills | |
| 6,456,056 | B1 * | 9/2002 | Katoh et al. | 324/76.41 |
| 6,738,269 | B2 * | 5/2004 | Nomiya et al. | 363/50 |
| 6,985,842 | B2 | 1/2006 | Grupp et al. | |
| 2001/0056330 | A1 | 12/2001 | Wills | |
| 2003/0147191 | A1 * | 8/2003 | Deng et al. | 361/62 |
| 2004/0243329 | A1 * | 12/2004 | Seki | 702/75 |
| 2005/0151532 | A1 | 7/2005 | Seki | |

FOREIGN PATENT DOCUMENTS

| | | |
|---|---|---|
| EP | 0 311 825 | 4/1989 |
| JP | 2002-500496 A | 1/2002 |
| JP | 2004-361124 A | 12/2004 |
| JP | 2005-204367 A | 7/2005 |
| JP | 2006-179323 A | 7/2006 |
| JP | 2007-325429 A | 12/2007 |

OTHER PUBLICATIONS

Phadke et al., "A New Measurement Technique for Tracking Voltage Phasors, Local System Frequency, and Rate of Change of Frequency" IEEE Transactions on Power Apparatus and Systems, 1983, vol. PAS-102, No. 5, pp. 1025-1038, XP008065061.
Supplementary European Search Report dated Jul. 2, 2010, issued in the corresponding European Application No. 07714493.9-1524.
International Search Report (PCT/ISA/210).

* cited by examiner

*Primary Examiner* — Drew A Dunn
*Assistant Examiner* — Timothy H Hwang
(74) *Attorney, Agent, or Firm* — Buchanan Ingersoll & Rooney PC

(57) ABSTRACT

The invention relates to a frequency measurement apparatus which is arranged in such a way as to obtain an amplitude, chord length and rotation phase angle of a voltage rotation vector by means of an integration method, and furthermore, obtain a change rate of the rotation phase angle, and a rotational acceleration change rate of the rotation vector, and measure a dynamic frequency by determining a frequency change rate for every step.

5 Claims, 7 Drawing Sheets

FREQUENCY MEASUREMENT APPARATUS

TECHNICAL FIELD

The present invention relates to a frequency measurement apparatus using an amplitude, chord length and rotation phase angle of a voltage rotation vector.

BACKGROUND ART

Recently, along with a current inside a power system becoming complicated, a supply of power of a high reliability and quality has been required and, particularly, there is an increasing need to improve a performance of a frequency measurement apparatus for a power system protection/control apparatus.

The present inventor has already proposed that a response method using a rotation vector on a complex plane is useful in improving a control and protection performance of the power system. This is based on a basic method which represents an alternating voltage as a vector rotating counterclockwise on the complex plane. For example, as described in Patent Document 1 (JP-A-2004-361124), there is a frequency measurement apparatus which is arranged in such a way as to measure a voltage of a power system at a timing of dividing one cycle of a reference wave into equal 4N parts (N is a positive integer), obtain a voltage rotation vector having an apex with the measured voltage as a real part coordinate, and a voltage measured 90 degrees before as an imaginary part coordinate, calculate a chord length of a chord connecting the apex of the voltage rotation vector and an apex of an immediately previous voltage rotation vector, obtain an effective value of voltage from a voltage measured between one timing and an immediately previous cycle of the reference wave, and calculate a frequency of the power system from a phase angle of a voltage rotation vector calculated based on an additional value of the chord length and the effective value of voltage.

FIG. 4, being a diagram of the voltage rotation vector represented on the complex plane, represents a voltage instantaneous value v of the power system as one rotating counterclockwise around an origin 0 on the complex plane. One cycle time of the reference wave is divided into 4N parts (N is an integer), and a time span of one step T is (for example, a 30 electric degree sampling (a sampling of 12 points per cycle) in a 60 Hz system, T=1/60/12=0.00138889 seconds).

A rotation phase angle per step can be calculated as follows.

$$\delta(t) = 2\sin^{-1}\left\{\frac{V_2(t)}{2V(t)}\right\} \quad (1)$$

where $V(t)$ is a voltage amplitude, and $V_2(t)$ is a chord length facing the rotation phase angle. Supposing that the amplitude and the chord length have been obtained by means of an integration calculation, using one cycle of instantaneous value data, furthermore, a frequency is calculated from a following expression.

$$f(t) = \frac{\psi(t)}{2\pi} f_0 = \frac{4N \cdot \delta(t)}{2\pi} f_0 \quad (2)$$

where $\psi(t)$ is a rotation phase angle of the voltage rotation vector for one cycle time, and $f_0$ is a reference wave frequency (50 Hz or 60 Hz).

However, as an error occurs in the voltage amplitude and the chord length due to a phase fluctuation such as a voltage fluctuation, it follows that a certain error is also included in a frequency measurement result of Expression (2). As described heretofore, Expression (2) is a so-called static frequency measurement method, and is of high measurement accuracy in a steady state (a sine wave), but the occurrence of the error is inevitable in the event that the phase fluctuation occurs due to the voltage fluctuation or the like. As a method of responding to this, an elimination of an effect of the voltage fluctuation by taking an average value of frequency measurement results for a long time is prevailing at present. For this reason, in this kind of frequency measurement apparatus, a real-time frequency measurement is impossible, affecting a system control/protection apparatus necessary for a high-speed system frequency measurement. It is common knowledge in the industry that a general frequency relay requires a long collation time (for example, a collation time of 90 ms or more in the 60 Hz system).

Patent Document 1: JP-A-2004-361124

DISCLOSURE OF THE INVENTION

Problems that the Invention is to Solve

As above, in the static frequency measurement apparatus, the occurrence of the certain measurement error is inevitable, and a power system control/protection apparatus, for which it is necessary to ascertain a high-speed and high-precision system frequency, has an intrinsic limitation. The invention, having been contrived bearing this point in mind, has an object of providing a dynamic high-precision frequency measurement apparatus which has no effect of a noise or the phase fluctuation (the voltage fluctuation).

Means for Solving the Problems

The frequency measurement apparatus according to the invention is characterized by including: means which calculates an amplitude, chord length and rotation phase angle of a voltage rotation vector by means of an integration method; means which calculates a rotational acceleration of the rotation vector; means which calculates a rotational acceleration change rate of the rotation vector; means which calculates a frequency increment, using an increment of the rotation phase angle; and means which calculates a dynamic frequency based on an increment between a frequency one step before and a frequency at a present time.

ADVANTAGE OF THE INVENTION

A real-time high-precision system frequency measurement contributes to the improvement in the performance of the power system control/protection apparatus.

BEST MODE FOR CARRYING OUT THE INVENTION

In order to deal with these problems, the inventor proposes a following expression for a dynamic frequency measurement.

$$f(t) = f(t-T) + \Delta f(t) = f(t-T) + \frac{\delta(t) - \delta(t-T)}{2\pi T} \quad (3)$$

where f(t) is a frequency at a present time, f(t−T) is a frequency measured one step before, δ(t) is a rotation phase angle calculated at the present time, and δ(t−T) is a rotation phase angle calculated one step before.

Furthermore, the inventor proposes a following dynamic frequency calculation expression, affixing a variable acceleration coefficient Nf at a front of a frequency increment in Expression (3).

$$f(t) = f(t-T) + N_f \cdot \frac{\delta(t) - \delta(t-T)}{2\pi T} \quad (4)$$

Figure 4:
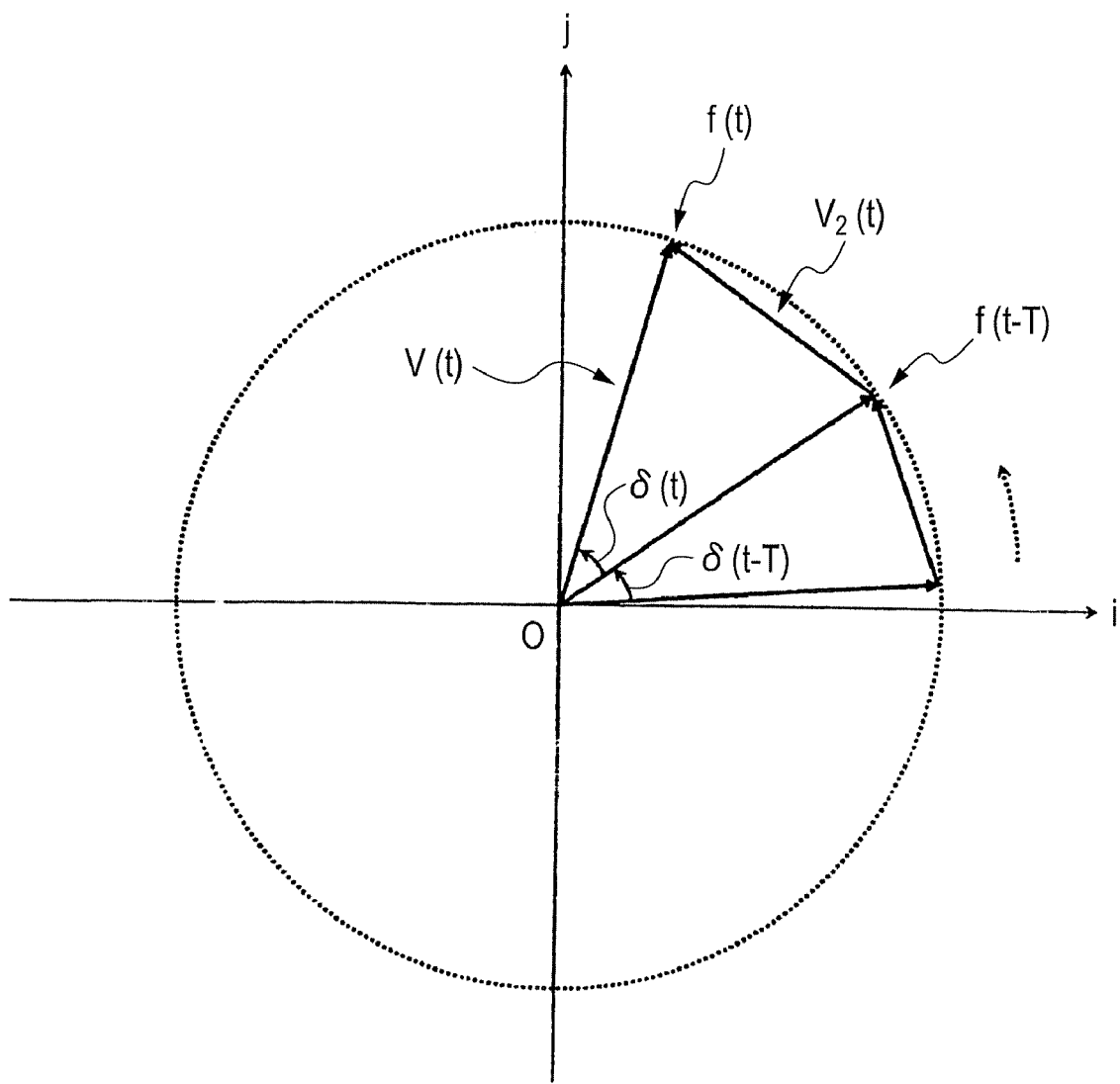
FIG. 4 is a diagram illustrating a rotation phase angle of a voltage rotation vector on a complex plane.

FIG. 4 can be referred to for a vector relationship between these expressions.

One of purposes in introducing the variable acceleration coefficient Nf is that, when the frequency is calculated from the above expressions, in the event that a frequency change rate changes at a given threshold value or greater (for example, in the event that the frequency change rate is 10 Hz/s or higher), it is determined to be voltage fluctuation data, and the frequency is latched with Nf set at 0. A second purpose is to reduce an acceleration or a deceleration at an initial cycle of the acceleration or deceleration.

This is because, in a case of a voltage fluctuation, the frequency increases or decreases within a short time of one to two cycles or less and, when a system frequency is changing, the increase or decrease of the frequency can be seen continually for three cycles or more. As the acceleration or deceleration is reduced using the variable acceleration coefficient, overall, a starting time of a frequency relay or a frequency change rate relay of a proposed method, which is the invention, becomes short. According to this kind of proposition, there being no need for a long time averaging process in order to avoid an effect of a voltage fluctuation, it is possible to carry out a high-precision frequency measurement in real time.

Consequently, in the event that there is no effect of the voltage fluctuation or the like (a voltage waveform is a sine wave), the system frequency is calculated by means of a static frequency measurement method of the heretofore described Expression (2) (a frequency identification is carried out). Contrarily, in the event that there is an effect of the voltage fluctuation or the like, a dynamic frequency is calculated from the heretofore described Expression (4). It is determined from a following expression whether or not there is an effect of the voltage fluctuation or the like.

$$\frac{d\omega(t)}{dt} = \frac{\Delta\omega(t) - \Delta\omega(t-T)}{T} < \varepsilon \quad (5)$$

In Expression (5), when an acceleration change rate of a rotation vector is lower than a threshold value ε, there is no sudden change of a frequency (a rotation phase angle), meaning that a static frequency calculation result matches an actual system frequency. The frequency identification is carried out at this point.

Embodiment 1

Figure 1:
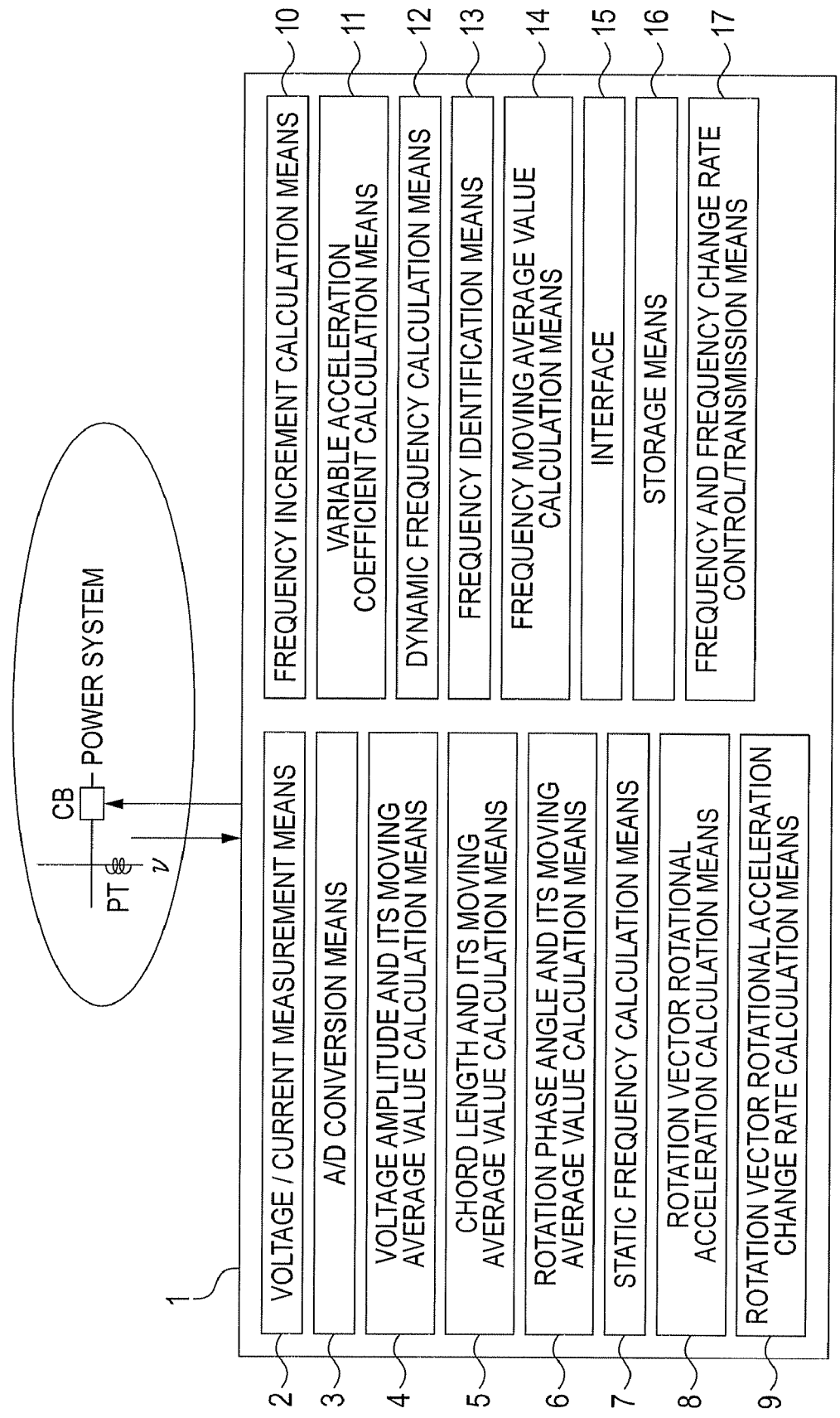
FIG. 1 is a diagram showing a configuration of a frequency measurement apparatus which is the invention.

FIG. 1 shows a configuration of a frequency measurement apparatus of the invention. In the figure, 1 is the frequency measurement apparatus, 2 voltage/current measurement means which inputs PT and CT time-series data, and 3 A/D conversion means which converts time-series analog data into time-series digital data. In a case in which the time-series digital data can be fed, it is possible to omit the voltage/current measurement means 2 and the A/D conversion means 3.

4 is voltage amplitude and its moving average value calculation means, which uses one cycle of voltage instantaneous value data to calculate a voltage amplitude by means of an integration method, and furthermore, uses one cycle or more of voltage amplitude calculation results to average the voltage amplitudes by means of a moving average method.

5 is chord length and its moving average value calculation means, which uses one cycle of voltage instantaneous value data to calculate a chord length by means of the integration method, and furthermore, uses one or more cycles of chord length calculation results to average the chord lengths by means of the moving average method.

6 is rotation phase angle and its moving average value calculation means, which uses the chord length and the voltage amplitude to calculate a rotation phase angle, and furthermore, uses one cycle or more of rotation phase angle calculation results to average the rotation phase angles by means of the moving average method.

7 is static frequency calculation means, which uses the rotation phase angle to calculate a static frequency in accordance with the heretofore described Expression (2). In the event that there is the effect of the voltage fluctuation or the like, a certain error exists in the calculated frequency, as described heretofore.

8 is rotation vector rotational acceleration calculation means, which calculates a rotational acceleration of the rotation vector, based on the rotation phase angle calculated at the present time, and on the rotation phase angle calculated one step before. 9 is rotation vector rotational acceleration change rate calculation means, which calculates a rotational acceleration change rate of the rotation vector, based on the rotation vector rotational acceleration calculated at the present time, and on the rotation vector rotational acceleration calculated one step before. 10 is frequency increment calculation means, which calculates a frequency increment, using a rotation phase angle increment.

11 is variable acceleration coefficient calculation means, which calculates a variable acceleration coefficient, based on an acceleration or deceleration history up to the present time. The variable acceleration coefficient is a number between 0 and 1 (including 0 and 1). 12 is dynamic frequency calculation means, which calculates a dynamic frequency, based on a frequency one step before, and the frequency increment at the present time.

13 is frequency identification means, which determines, when the rotation vector rotational acceleration change rate reaches zero, that there is no effect of the voltage fluctuation on a system, and compulsorily matches the dynamic frequency with a static frequency result. 14 is frequency moving average value calculation means, which uses one cycle or more of dynamic frequency calculation results to average the dynamic frequencies by means of the moving average method. 15 is an interface which displays the heretofore described measurement results, and 16 storage means which saves the measurement results. 17 is frequency and frequency change rate control/transmission means, which compares the measured frequency with a value set in advance and, in the event that it exceeds the set value, transmits a breaker trip command. Also, it compares the measured frequency change rate with a value set in advance and, in the event that it exceeds the set value, transmits the breaker trip command.

Figure 2:
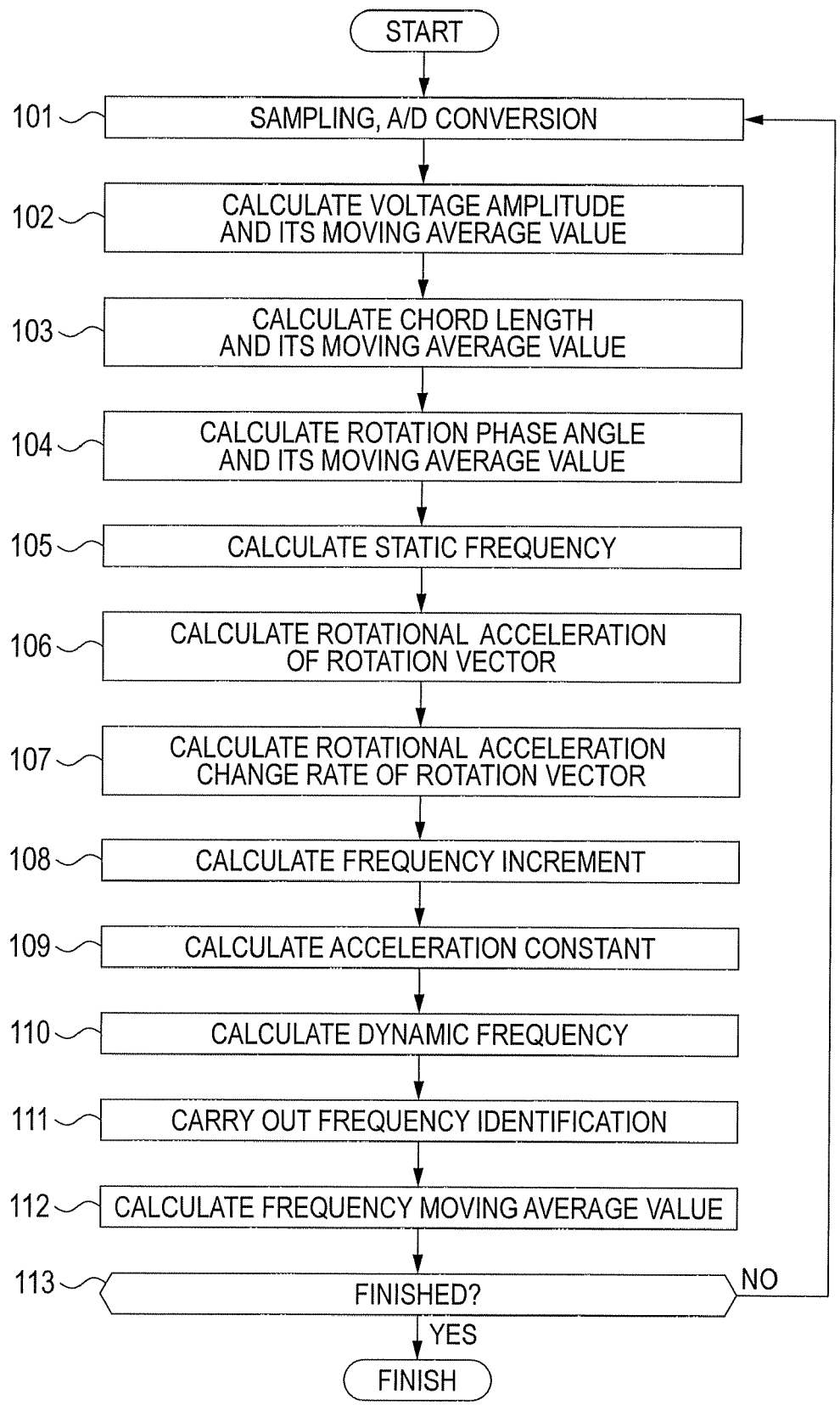
FIG. 2 is a flowchart illustrating an operation of the frequency measurement apparatus of the invention.

Hereafter, a detailed description will be given of an operation of the heretofore described frequency measurement apparatus, in accordance with a frequency measurement flowchart shown in FIG. 2.

Step 101 is a step which, as well as measuring a voltage/current instantaneous value, by a sampling, by means of the voltage/current measurement means 2, carries out an A/D conversion by means of the A/D conversion means 3.

A phase voltage (A phase voltage, B phase voltage and C phase voltage) or a line voltage (AB line voltage, BC line voltage and AC line voltage) can be used as an input voltage for the frequency measurement. It is acceptable that either the phase voltage or the line voltage is used as a voltage to be described hereafter.

According to the Fourier transform, the voltage instantaneous value of a circuit can be expressed as in Expression (6)

$$v = V e^{j(\omega t + \varphi)} + \sum_{k=1}^{M} V_k e^{j(\omega_k t + \varphi_k)} \tag{6}$$

where V is a fundamental voltage amplitude, $\omega$ is a fundamental angular velocity, $\varphi$ is an initial phase of a fundamental voltage, $V_k$ is a kth harmonic voltage amplitude, $\omega_k$ is an angular velocity of a kth harmonic voltage, $\varphi_k$ is an initial phase of the kth harmonic voltage, and M is an optional size of a positive integer. That is, a voltage instantaneous value is configured of a voltage fundamental component and a plurality of voltage harmonic components.

In a following development of expressions, the voltage harmonic components are omitted in order to facilitate a description. This does not entail ignoring the voltage harmonic components but, in the invention, an effect of the harmonic components is eliminated by means of an integration calculation method.

The heretofore described voltage rotation vector can be divided into a following real part and imaginary part.

$$\left.\begin{aligned} v_{re} &= V\cos(\omega t + \varphi) \\ v_{im} &= V\sin(\omega t + \varphi) \end{aligned}\right\} \tag{7}$$

In the following expressions, v indicates $v_{re}$.

Step 102 being a step which calculates the voltage amplitude and its moving average value, the voltage amplitude and its moving average value calculation means 4 of FIG. 1 corresponds to this.

Theoretically, the voltage amplitude of the rotation vector is calculated from a following expression.

$$V(t) = \sqrt{\frac{2}{T_0} \int_{-T_0}^{0} v^2(t) dt} \tag{8}$$

In order to increase a calculation accuracy in a system frequency shifted to a reference frequency, the voltage amplitude is calculated from a following expression.

$$V(t) = \sqrt{\frac{1}{2N}\left[\sum_{k=N}^{3N-1} v^2(t-kT) - \sum_{k=0}^{2N-1} v(t-kT)\cdot v\{t-(2N+k)T\}\right]} \tag{9}$$

Furthermore, voltage amplitude values are averaged by means of a moving average. Herein, a calculation is made by means of a moving average of one cycle but, the longer a span, the smaller a fluctuation.

$$V_{ave}(t) = \frac{1}{4N}\sum_{k=0}^{4N-1} V(t-kT) \tag{10}$$

Next, in step 103, the chord length and its moving average value is calculated by the chord length and its moving average value calculation means 5.

Theoretically, the chord length of the rotation vector voltage, that is, a chord length $V_2(t)$ facing the rotation phase angle is calculated from a following expression.

$$V_2(t) = \sqrt{\frac{2}{T_0}\int_{-T_0}^{0} \{v(t) - v(t-T)\}^2 dt} \tag{11}$$

In order to increase the calculation accuracy in the system frequency shifted to the reference frequency, the chord length is calculated from a following expression.

$$V_2(t) = \sqrt{\frac{1}{2N}\left[\sum_{k=N}^{3N-1} v_2^2(t-kT) - \sum_{k=0}^{2N-1} v_2(t-kT)\cdot v_2\{t-(2N+k)T\}\right]} \tag{12}$$

Furthermore, chord length amplitude values are averaged by means of the moving average. Herein, a calculation is made by means of the moving average of one cycle but, the longer a span, the smaller a fluctuation.

$$V_{2ave}(t) = \frac{1}{4N}\sum_{k=0}^{4N-1} V_2(t-kT) \tag{13}$$

Subsequently, step 104 is a step which calculates the rotation phase angle and its moving average value. The rotation phase angle and its moving average value calculation means 6 of FIG. 1 corresponds to this.

Firstly, the rotation phase angle is calculated from a following expression.

$$\delta(t) = 2\sin^{-1}\left\{\frac{V_{2ave}(t)}{2V_{ave}(t)}\right\} \quad (14)$$

Furthermore, the rotation phase angles are averaged by the moving average. Herein, a calculation is made by means of the moving average of one cycle but, the longer a span, the smaller a fluctuation.

$$\delta_{ave}(t) = \frac{1}{4N}\sum_{k=0}^{4N-1}\delta(t-kT) \quad (15)$$

In step 105, the static frequency is calculated by the static frequency calculation means 7.

The static frequency is calculated from a following expression.

$$f(t) = \frac{\psi(t)}{2\pi}f_0 = \frac{4N\cdot\delta(t)}{2\pi}f_0 \quad (16)$$

The operation up to this step is approximately the same as that of a patent application which the present inventor has previously proposed (Japanese Patent Publication No. 2007-325429A "ROTATION PHASE ANGLE MEASURING DEVICE, FREQUENCY MEASURING DEVICE USING THE SAME, SYNCHRONOUS PHASER MEASURING DEVICE, OPENING/CLOSING POLE PHASE CONTROLLER, SYNCHRONOUS POWER SUPPLY DEVICE AND PHASE DISCRIMINATING DEVICE". (It only differs in calculating the moving average value of the rotation phase angle.)

A dynamic frequency measurement portion starting with step 106, first, the rotation vector rotational acceleration is calculated by the rotation vector rotational acceleration calculation means 8.

This is for obtaining the rotation vector rotational acceleration from a following expression, based on the rotation phase angle measured at the present time, and on the rotation phase angle measured one step before.

$$\frac{d\delta(t)}{dt} = \frac{\delta(t)-\delta(t-T)}{T} = \Delta\omega(t) \quad (17)$$

Next, in step 107, the rotation vector rotational acceleration change rate is calculated from a following expression. The rotation vector rotational acceleration change rate calculation means 9 of FIG. 1 carries this out.

$$\frac{d\omega(t)}{dt} = \frac{\Delta\omega(t)-\Delta\omega(t-T)}{T} \quad (18)$$

Subsequently, in step 108, the frequency increment is calculated. The frequency increment calculation means 10 carries this out.

This is for obtaining a difference between the frequency at the present time and the frequency one step before, based on the rotation phase angle measured at the present time, and on the rotation phase angle measured one step before.

$$\Delta f(t) = \frac{\delta(t)-\delta(t-T)}{2\pi T} \quad (19)$$

Step 109, being a step which calculates a variable acceleration coefficient (refer to the variable acceleration coefficient calculation means 11), obtains a variable acceleration coefficient Nf (0 to 1). Details will be described later based on a variable acceleration coefficient calculation flowchart of FIG. 3.

Next, in step 110, a dynamic system frequency is calculated (refer to the dynamic frequency calculation means 12).

A dynamic frequency at the present time is obtained from a following expression, based on the frequency one step before, the rotation phase angle and the variable acceleration coefficient.

$$f_1(t) = f_1(t-T) + N_f \cdot \frac{\delta(t)-\delta(t-T)}{2\pi T} \quad (20)$$

Next, in step 111, it is determined whether or not a change rate of the rotation vector rotational acceleration is lower than a threshold value dfSET3.

$$\left|\frac{d\omega(t)}{dt}\right| < df_{SET3} \quad (21)$$

If the above expression is satisfied, a frequency identification is carried out (refer to the frequency identification means 13). If the above expression is not satisfied, the frequency identification is not carried out.

That is, the static frequency calculated from Expression (16) is compulsorily taken to be a dynamic frequency measurement result.

$$f_1(t)=f(t) \quad (22)$$

In step 112, a frequency moving average value is calculated from Expression (23) (refer to the frequency moving average value calculation means 14).

This moving average calculation is made in order to reduce a fluctuation due to a noise of the frequency measurement result. Herein, the calculation is made for one cycle time but, the longer a span, the more stable a result.

$$f_{1ave}(t) = \frac{1}{4N}\sum_{k=0}^{4N-1}f_1(t-kT) \quad (23)$$

Finally, it is determined whether or not the operation is finished with step 113. If the operation is not finished, it proceeds to step 101.

Figure 3:
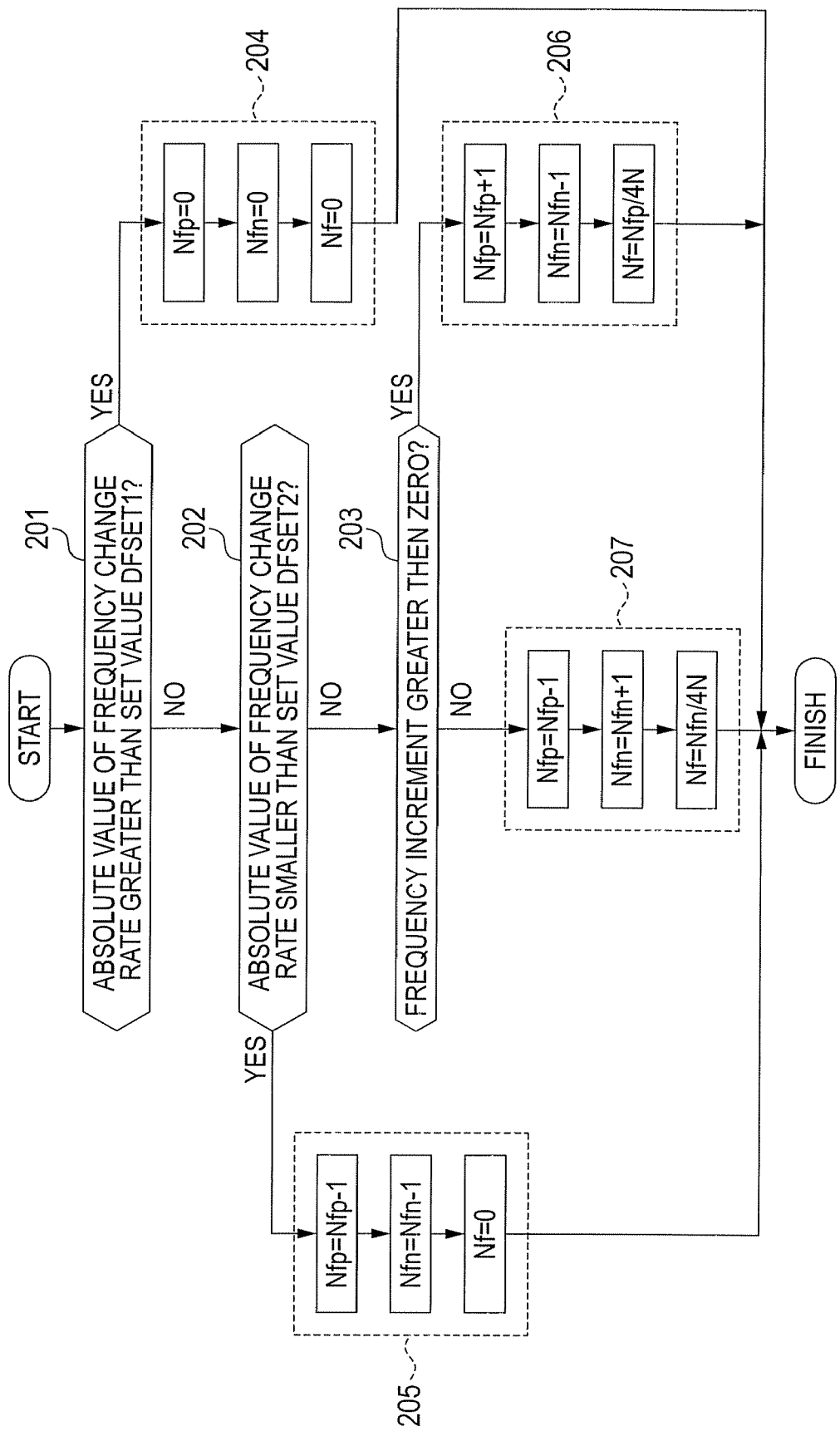
FIG. 3 is a flowchart of a variable acceleration coefficient calculation in the frequency measurement apparatus of the invention.

Next, a detailed description will be given of a variable acceleration coefficient calculation step, in accordance with the variable acceleration coefficient calculation flowchart shown in FIG. 3.

Step 201 is a step which determines whether or not the frequency change rate is higher than a set value $df_{SET1}$ In order to make this determination, first, a frequency change rate per step is obtained from a following expression.

$$\frac{df(t)}{dt} = \frac{\delta(t) - \delta(t-T)}{2\pi T^2} \quad (24)$$

4N is a number of reference wave sampling points, and T is a time span of one step. A unit of the above expression is hertz per second (Hz/s). A calculation of the variable acceleration coefficient is made, depending on whether or not an absolute value of the frequency change rate is greater than the set value.

$$\left|\frac{df(t)}{dt}\right| > df_{SET1} \quad (25)$$

If it is greater than the set value (for example, 10 Hz/s), it is determined to be voltage fluctuation data, and the operation proceeds to step 204. If it is smaller than the set value (for example, 10 Hz/s), the operation proceeds to step 202.

Step 202 is a step which determines whether or not the heretofore described frequency change rate is lower than a set value $df_{SET2}$.

$$\left|\frac{df(t)}{dt}\right| < df_{SET2} \quad (26)$$

If the above expression is satisfied, it is determined that the frequency falls under a dead band, and the operation proceeds to step 205.

If the above expression is not satisfied, the operation proceeds to step 203.

In step 203, it is determined whether or not the frequency increment is greater than zero.

$$\Delta f(t) > 0 \quad (27)$$

If the frequency increment is greater than zero, the frequency takes on an acceleration mode, and the operation proceeds to step 206.

If the frequency increment is smaller than zero, the frequency takes on a deceleration mode, and the operation proceeds to step 207.

Next, a description will be given of the heretofore described step 204. In this step, if the voltage fluctuation data are determined, the frequency is latched and, as well as the variable acceleration coefficient being reduced to zero, a resetting of variable acceleration coefficient counts is carried out.

The voltage fluctuation data are determined, and a variable acceleration coefficient positive count Nfp, a variable acceleration coefficient negative count Nfn, and a variable acceleration coefficient Nf are reduced to zero.

$$Nfp=0, Nfn=0, Nf=0 \quad (28)$$

In step 205, it is determined that the frequency falls under the dead band, the frequency is latched, the variable acceleration coefficient positive count Nfp and the variable acceleration coefficient negative count Nfn are each reduced by one, and the variable acceleration coefficient is reduced to zero. The resetting of the variable acceleration coefficient counts is not carried out. However, minimum values of Nfp and Nfn are zero.

$$Nfp=Nfp-1, Nfn=Nfn-1, Nf=0 \quad (29)$$

In step 206, the frequency takes on the acceleration mode, and the variable acceleration coefficient positive count Nfp is increased by one. However, a maximum value of Nfp is 4N. The variable acceleration coefficient negative count Nfn is reduced by one. However, the minimum value of Nfn is zero.

$$Nfp=Nfp+1, Nfn=Nfn-1, Nfp/4N \quad (30)$$

In step 207, the frequency takes on the deceleration mode, and the variable acceleration coefficient negative count Nfn is increased by one. However, a maximum value of Nfn is 4N. The variable acceleration positive count Nfp is reduced by one. However, the minimum value of Nfp is zero.

$$Nfp=Nfp-1, Nfn=Nfn+1, Nf=Nfn/4N \quad (31)$$

Although the description of this flow is given with the variable acceleration coefficient as one cycle (4N points), an acceleration of two cycles (8N points) or longer is also possible.

Next, a description will be given of the frequency and frequency change rate control/transmission means 17 of FIG. 1. For example, in a case of an over frequency relay (OFR), when a measured dynamic frequency exceeds a threshold value, a breaker CB of a power generator of the power system is tripped, and a system protection is implemented.

$$f_1(t) > f_{1SET} \quad (32)$$

where $f_{1SET}$ is an OFR relay threshold value.

Also, in a case of an under frequency relay (UFR), when the measured dynamic frequency is lower than the threshold value, the breaker CB of the power system is tripped, and the system protection is implemented.

$$f_1(t) < f_{2SET} \quad (33)$$

where $f_{2SET}$ is a UFR relay threshold value.

Furthermore, in a case of a frequency change rate relay, when an absolute value of a measured dynamic frequency change rate exceeds a threshold value, the breaker CB of the power system is tripped, and the system protection is implemented.

$$|f_1(t) - f_1(t-3T_0)| > df_{4SET} \quad (34)$$

where $df_{4SET}$ is a frequency change relay threshold value, $f_1(t)$ is a measured dynamic frequency value at the present time, and $f_1(t-3T_0)$ is a measured value of a dynamic frequency at a point before a third cycle. Herein, a calculation is made using a difference between frequencies before and after the third cycle, but it is also possible to make the calculation in another time span.

Next, a consideration will be given of a simulation result of the invention.

Figure 5:
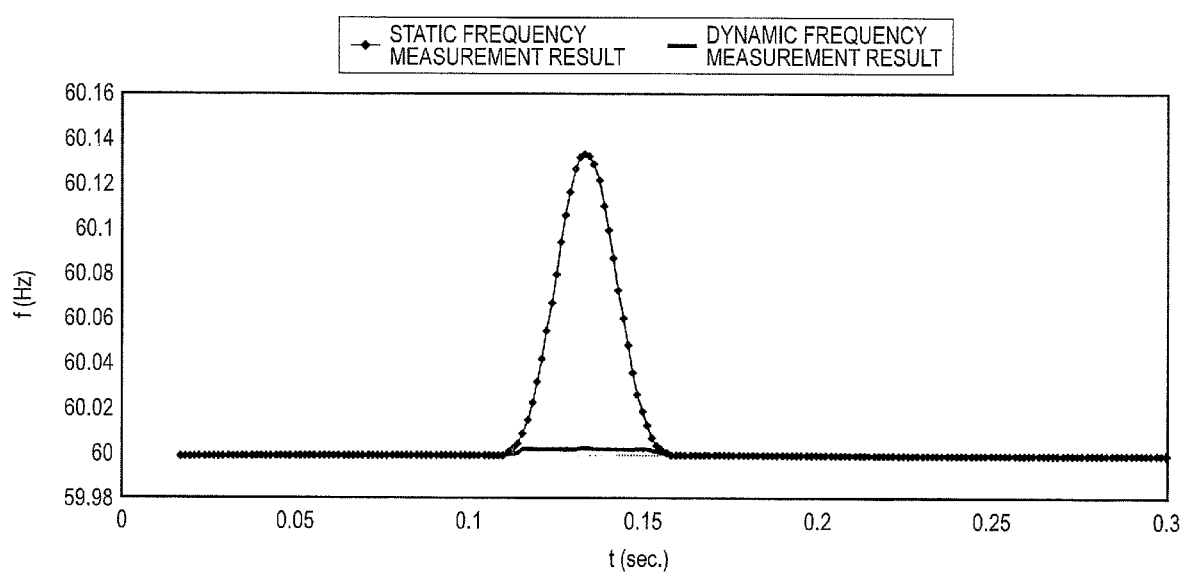
FIG. 5 is a graph showing a result of a measurement of a static frequency and a dynamic frequency in a case in which there is a phase fluctuation (a voltage fluctuation)

FIG. 5 showing static frequency and dynamic frequency measurement results in a case in which there is a phase fluctuation (the voltage fluctuation), a theoretical value of an input frequency results from a measurement of the static frequency and the dynamic frequency in a case of causing a voltage phase fluctuation twice (0.03490659 radian) at a point of 0.1111111 seconds at 60 Hz. The static frequency measurement result (a thin line) is an occurrence of a large fluctuation, while the dynamic frequency measurement result (a heavy line) is a small fluctuation.

Figure 6:
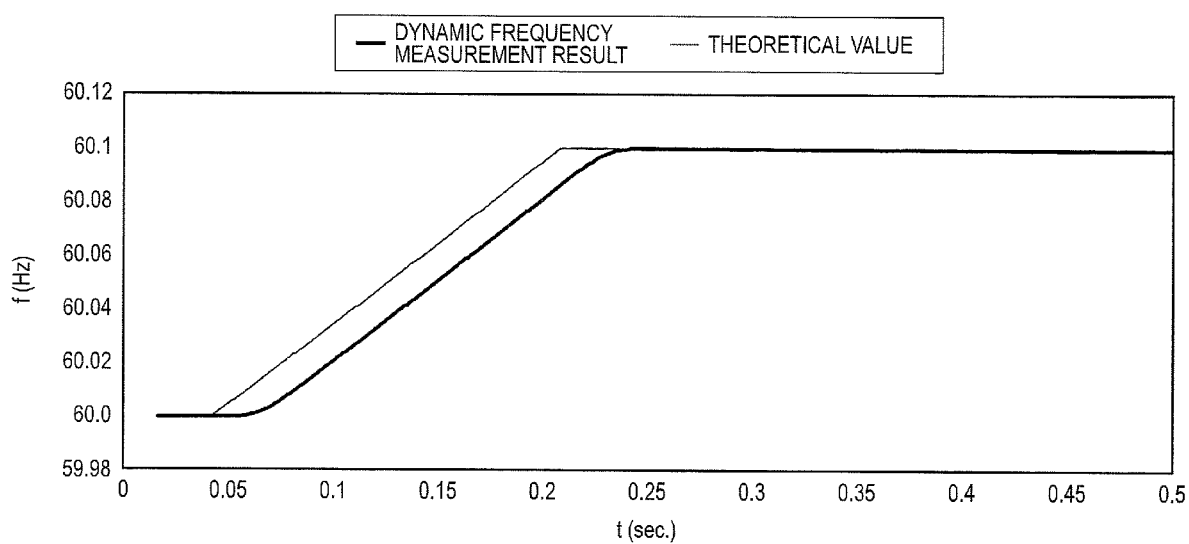
FIG. 6 is a graph showing frequency measurement results in a case in which the frequencies change.

FIG. 6 shows a frequency measurement result in a case in which there is a frequency change.

The input frequency is accelerated at a speed of 0.6 Hz/s at a point of 0.043056 seconds, and the frequency change is stopped at a point of 0.208333 seconds. In this way, the invention obtains a high-precision real-time frequency measurement result, following an actual system frequency.

A backward shift of the frequency measurement value with respect to the theoretical value when the frequency is changing is due to a delay in response of a frequency calculation by means of a rotation vector measurement method.

Figure 7:
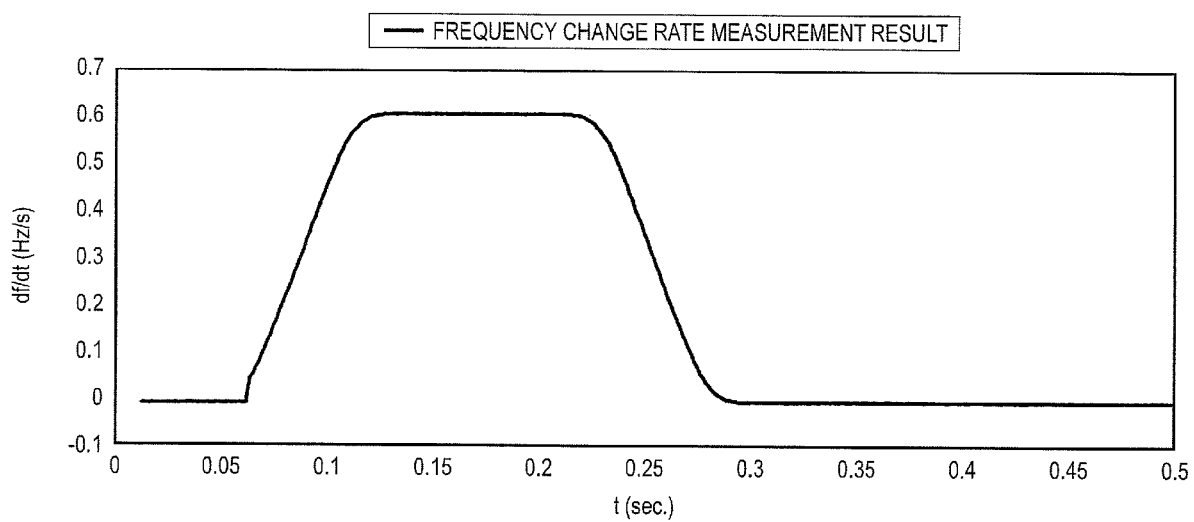
FIG. 7 is a graph showing a frequency change rate measurement result in the case in which the frequency changes.

FIG. 7 shows a frequency change rate measurement result in the case in which there is the frequency change.

As will be appreciated in comparison with FIG. 6, there is a certain delay in response, but the frequency change rate is also correctly measured. The frequency change rate is calculated from the difference between the frequencies before and after the third cycle.

The invention claimed is:

1. A frequency measurement apparatus configured to protect a power system using a breaker, comprising:
    a reception unit configured to receive analog time-series data of an alternating current (AC) voltage signal;
    a converter configured to convert the analog time-series data to digital time-series data of the AC voltage signal;
    a calculating unit configured to calculate at least:
        an amplitude, a chord length and a rotation phase angle of a voltage rotation vector of the received AC voltage signal from the digital time-series data, the chord length and rotation phase angle being calculated by an integration method,
        a rotation phase angle increment based on an increment between a rotation phase angle of the AC voltage signal one step before and a current rotation phase angle of the AC voltage signal, and
        a dynamic frequency which is based on:
            (1) the calculated rotation phase angle increment and a previously calculated frequency in response to a frequency change rate not equaling or exceeding a predetermined threshold value, and
            (2) a previously calculated frequency in response to the frequency change rate equaling or exceeding the predetermined threshold value; and
    a transmitter configured to transmit a breaker trip command, responsive to the calculated dynamic frequency exceeding a second threshold value, to trip the breaker
    wherein the calculating unit is configured to calculate the dynamic frequency based on introducing a variable acceleration coefficient having a value that changes in accordance with the frequency change rate and, in an event that the frequency change rate is higher than or equal to the predetermined threshold value, the calculating unit is configured to determine the frequency change rate to be voltage fluctuation data, and latch the current frequency while, in an event that the frequency change rate is lower than the predetermined threshold value, reduces the variable acceleration coefficient at an initial cycle of an acceleration or a deceleration.

2. The frequency measurement apparatus according to claim 1, wherein the calculating unit is configured to calculate a static frequency, using the rotation phase angle; and, when a rotational acceleration change rate of the rotation vector is less than a threshold value, matches the dynamic frequency with a static frequency measurement calculation result.

3. The frequency measurement apparatus according to claim 1, wherein the dynamic frequency is calculated from a following expression:

$$f(t) = f(t-T) + N_f \cdot \frac{\delta(t) - \delta(t-T)}{2\pi T}$$

where $N_f$ is the variable acceleration coefficient, f(t) is the dynamic frequency at a present time, f(t-T) is the frequency measured one step before the present time, $\delta(t)$ is the rotation phase angle calculated at the present time, and $\delta(t-T)$ is the rotation phase angle calculated one step before the present time.

4. The frequency measurement apparatus according to claim 1, wherein the variable acceleration coefficient is a number 0, 1 or between 0 and 1.

5. The frequency measurement apparatus according to claim 1, wherein the calculating unit is configured to average the dynamic frequencies, by a moving average method, using one or more cycles of dynamic frequency calculation results.

* * * * *